US006314149B1

(12) United States Patent
Daffron

(10) Patent No.: US 6,314,149 B1
(45) Date of Patent: Nov. 6, 2001

(54) METHOD AND APPARATUS FOR REPHASING A VOLTAGE CONTROLLED CLOCK, OR THE LIKE

(75) Inventor: Christopher J. Daffron, Tustin, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/062,159

(22) Filed: Apr. 16, 1998

(51) Int. Cl.[7] .................................................. H04L 7/00

(52) U.S. Cl. .......................... 375/371; 375/376; 327/158; 327/161

(58) Field of Search .................................... 375/376, 373, 375/371, 327; 327/156, 158, 161, 162, 163, 280, 287

(56) References Cited

U.S. PATENT DOCUMENTS 4,943,745 * 7/1990 Watanabe et al. .................... 307/603
5,015,892 * 5/1991 Parsi et al. ............................ 307/600
5,379,299 * 1/1995 Schwartz .............................. 370/108
5,687,202 * 11/1997 Eitrheim .............................. 375/376
5,771,264 * 6/1998 Lane ..................................... 375/376
5,804,991 * 9/1998 Hu ........................................ 326/162
5,838,179 * 11/1998 Schmidt ............................... 327/156
5,900,754 * 5/1999 Nakatani .............................. 327/158
5,945,854 * 8/1999 Sadowski ............................. 327/156
5,955,910 * 9/1999 Levin et al. ......................... 327/393
5,973,525 * 10/1999 Fujii .................................... 327/158

* cited by examiner

*Primary Examiner*—Stephen Chin
*Assistant Examiner*—Dac V. Ha
(74) *Attorney, Agent, or Firm*—W. Daniel Swayze, Jr.; W. James Brady; Frederick J. Telecky, Jr.

(57) ABSTRACT

A pulse rephasing circuit and method for receiving an input signal and generating an output signal includes a circuit for generating a control voltage of magnitude related to a phase difference between the input and output signals. The circuit for generating a control voltage may be, for example, a multiplier circuit to which both the input and output signals are applied. A delay circuit receives the input signal to produce an output signal that has been delayed with respect to the input signal an amount related to the magnitude of the control voltage. The delay circuit may include a capacitor, a circuit for linearly charging the capacitor, a circuit for comparing the control voltage to a voltage charged on the capacitor, and a circuit for generating a state change in the output signal when the voltage charged on the capacitor exceeds the control voltage.

15 Claims, 2 Drawing Sheets

50
58
60
84
82
94
90
110
112
52
55
106
87
86
IN
56
ΔV
+
–
53
108
66
65
104
106
63
98
DISCHARGE
114
62
99
OUT
100
102
CHARGE
116
70
72
OUT 2
I
C
78
76
96
92
74

METHOD AND APPARATUS FOR REPHASING A VOLTAGE CONTROLLED CLOCK, OR THE LIKE

BACKGROUND OF THE INVENTION

1. Field of the Invention

This invention relates to improvements in methods and circuitry for rephasing a signal, and, more particularly, to improvements in methods and circuitry for rephasing an input signal based upon an error signal voltage, for use, for example, in rephasing a voltage controlled clock signal, or the like.

2. Relevant Background

Many circuits that depend upon or use clock signals have an adjustable delay circuit to delay the clock pulse by an adjustable amount. One such circuit includes an adjustable delay element that receives and delays the input signal to produce an output that is connected to a phase lock loop, which generates a clock signal. The clock signal is fed back to a multiplier that multiplies it by the input signal. The product is a phase error current signal, which is applied to the delay circuit to control the delay thereof. Thus, the phase of the clock is adjusted relative to the input signal to maintain a constant phase delay value.

This function is called clock rephasing. The result of this closed loop system achieves both a frequency and phase alignment of the signal and clock at the multiplier.

The previous delay methods used the error current directly to adjust a ramp current that is used to delay the input signal to achieve the desired phase of the output signal. However, using such techniques has several disadvantages. More specifically, the initialization of the delay circuit that is associated with such delay method involves fairly complicated analysis. In particular, the circuitry that may be associated with the overall delay circuitry may itself have numerous circuits that have inherent delay creating effects. In order to eliminate the effects of such delay creating circuits an overall rephasing circuit, for example, currents in the delay circuitry need to be determined. However, the overall delay is generally regarded as being inversely proportional to a sum of correcting currents. Moreover, each of the correcting currents may influence the delays that are associated with the various delay creating circuits. Thus, the cancellation of the delays can be an extremely complex problem.

SUMMARY OF THE INVENTION

It is an object of the invention to provide an improved delay element for use in a clock rephasing system, or the like.

It is another object of the invention to provide an improved clock rephase system using the improved delay element.

It is another object of the invention to provide an improved clock rephase system of the type described, in which individual contributions of most propagation delays in the circuit can be compensated, without affecting each other.

These and other objects, features and advantages of the invention will be apparent to those skilled in the art from the following detailed description of the invention, when read in conjunction with the accompanying drawings and appended claims.

Thus, according to a broad aspect of the invention, a pulse rephasing circuit for receiving an input signal and generating an output signal is presented. The circuit includes a circuit for generating a control voltage of magnitude related to a phase difference between the input and output signals. The circuit for generating a control voltage may be, for example, a multiplier circuit to which both the input and output signals are applied. A delay circuit receives the input signal to produce an output signal that has been delayed with respect to the input signal an amount related to the magnitude of the control voltage. The delay circuit may include a capacitor, a circuit for linearly charging the capacitor, a circuit for comparing the control voltage to a voltage charged on the capacitor, and a circuit for generating a state change in the output signal when the voltage charged on the capacitor exceeds the control voltage.

According to another broad aspect of the invention, a pulse rephasing circuit is provided that has a multiplier for receiving an input signal and a delay circuit for receiving the input signal to produce an output signal that has been delayed with respect to the input signal. A phase lock loop receives the output signal to produce a clock signal for application to another input of the multiplier circuit. An output of the multiplier circuit provides a control voltage to the delay circuit that is related in magnitude to a phase difference between the input signal and the clock signal, whereby the delay circuit is enabled to operate to delay the input signal an amount related to the magnitude of the control voltage.

According to yet another broad aspect of the invention, a method is presented for rephasing an input signal. The method includes the acts of producing an output signal based upon and having the same frequency as the input signal, generating a voltage of magnitude related to a phase difference between the input and output signals, and delaying the input signal an amount related to the magnitude of the control voltage prior to the act of producing an output signal.

According to still another broad aspect of the invention, a delay circuit is presented for delaying an input signal an amount depending upon a control voltage. The delay circuit has a capacitor and a circuit for linearly charging a voltage onto the capacitor. A switch is controlled by the input signal to connect the circuit for linearly charging the capacitor to the capacitor. A comparator generates an output signal, and a circuit is provided for generating a voltage proportional to a phase difference between the input signal and the output signal. The comparator is connected to compare the voltage charged on the capacitor with the voltage proportional to a phase difference between the input signal and the output signal to provide the output signal when the voltage charged on the capacitor becomes larger than the voltage proportional to a phase difference between the input signal and the output signal.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

According to a preferred embodiment of the invention, in rephasing an input signal, the delay method of the invention directs the error current through a resistive element to adjust the trip voltage, while keeping the ramp current and capacitance constant. Thus, the delay time is directly proportional to the voltage variation and inversely proportional to the current variation.

The advantage of varying the trip voltage, compared to varying the ramp current, becomes apparent when one examines the role of the delay element in a clock rephase system. The signal and clock take different paths toward the multiplier circuit, with each path containing many individual propagation obstacles that are subject to both process and temperature variations. For example, many process and temperature dependent propagation delays through the pulse qualifier alone exist. However, the single phase delay provided by the delay element is the only compensation for all of the propagation delays in the clock rephase system. Having the capability of independently adjusting for each of the major propagation delays with the use of trim schemes or other feedback systems in addition to the phase error signal would be advantageous. By using the trip voltage to control the phase delay, a composite or superposition of many voltages can be created, each used to linearly compensate for various propagation delays without affecting the others. In contrast, using the ramp current for phase delay makes this impossible since the individual current elements that comprise the total current are “coupled” together and cannot be adjusted without affecting the others. Additionally, each current element now has a nonlinear relationship to time delay.

A second advantage to the voltage adjustment method is having a fixed relationship between voltage variation, due to noise, and delay variation, otherwise known as jitter. The ratio of jitter to the overall phase delay range affects the performance of the phase lock loop. Therefore, setting the ratio to a known acceptable level is desirable. The new method allows propagation delays to be adjusted without affecting this ratio, since the current or “slope” is fixed. However, the old current adjustment method varies the “slope” and therefore the jitter ratio, potentially increasing it beyond an acceptable level.

Figure 1:
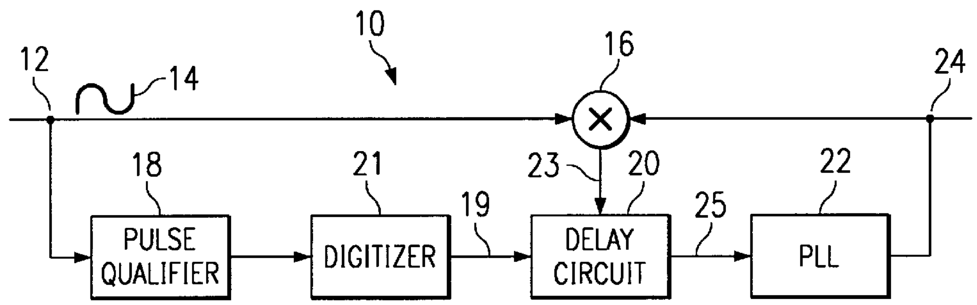
FIG. 1 is a block diagram of a clock rephasing circuit, incorporating a delay circuit or element, all according to a preferred embodiment of the invention.

A block diagram of a voltage controlled clock rephasing circuit 10 of the invention is shown in FIG. 1. The circuit 10 has an input node 12 to which an input signal 14 may be applied. The input signal 14, which may be an analog or digital signal, is divided along two paths. The first path is directed to an input of a multiplier circuit 16, and the second path may be applied to an input of a desired signal modifying circuit, for example, a pulse qualifier circuit 18, as shown. It will be appreciated that if the input signal is processed by circuitry, such as the pulse qualifier circuit shown, one or more delays may be imposed onto the signal. Such delays, as will become apparent, are known, and may be compensated by directly adding a compensating voltage to the delay controlling voltage within the delay circuitry 20.

The output from the pulse qualifier circuit 18 is connected to a digitizer 21 (if the input signal 14 is an analog signal), which digitizes the signal for application on line 19 to the input of the delay circuit 20. The delay circuit 20 delays the signal an adjustable amount in accordance with the voltage derived from the multiplier circuit 16, also as described below in detail. The output from the delay circuit 20 is connected to an input of a phase lock loop 22, the output of which is fed back to a second input of the multiplier circuit 16. The output of the phase lock loop 22 provides the rephased clock signal, which provides the if output signal from the circuit 10 on node 24. Thus, the input signal 14 is multiplied by the clock signal developed at the output of the phase lock loop 22, having been delayed by the delay circuit to produce an output on line 23 representing a phase error signal voltage which affects and controls the delay provided by the delay circuit 20.

The multiplier circuit 16 may be of any convenient type that generates an output current that represents the product of the input signals. For example, a Gilbert multiplier that is operating in a mode in which an analog signal and digital signal are multiplied may be used, whereby the product is a current magnitude representing the phase difference between the two input signals.

Figure 2:
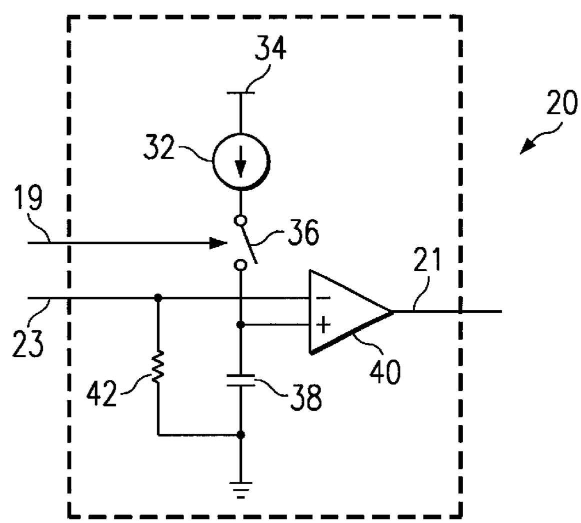
FIG. 2 is a block diagram of a delay element for use in a clock rephasing circuit, such as the clock rephasing circuit of FIG. 1, according to a preferred embodiment of the invention.

Details of the delay element circuit 20, according to a preferred embodiment of the invention, are shown in the circuit illustrated in FIG. 2. The circuit 20 includes a current source 32 connected between a voltage supply 34 and a switch 36, which is in series with a capacitor 38, connected to ground. A comparator 40 receives at its noninverting input a voltage developed across the capacitor 38. The output from the multiplier 16 is applied to a resistor 42 to generate a voltage for application to the noninverting input of the comparator 40. Thus, when the voltage that is developed across the capacitor 38 exceeds the input voltage on the noninverting input of the comparator 40, the output 21 changes state. The output developed on line 21 from the comparator 40 is delivered to the input of the phase lock loop 22 shown above in FIG. 1.

Thus, in operation, the digitized input signal on line 19, when high, closes switch 36, allowing current from the current source 32 to begin charging the capacitor 38. When the capacitor 38 reaches a voltage that exceeds the voltage on the noninverting input of the comparator 40, the output on line 21 changes state to provide a signal to which the phase lock loop 22 can lock. The capacitor is then discharged (by circuitry best seen in FIG. 3) and the process repeated.

Figure 3:
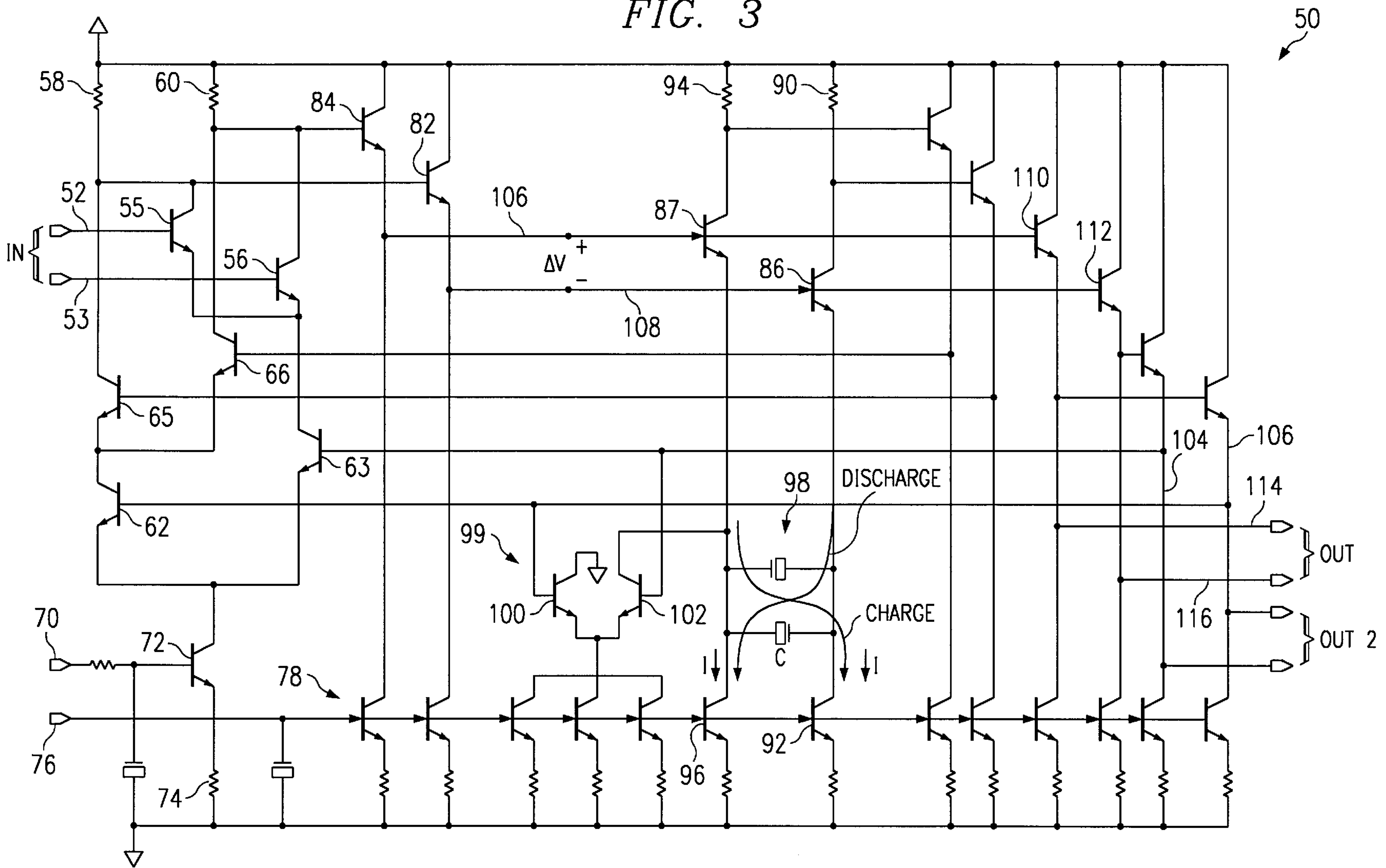
FIG. 3 is a schematic diagram of a delay circuit that employs differential signal inputs and outputs, according to another preferred embodiment of the invention.

With reference additionally now to FIG. 3, an electrical schematic diagram of a delay circuit according to another preferred embodiment of the invention, using differential voltage inputs and outputs is shown. The operation of the delay circuit 50, which uses differential voltage processing, is essentially the same as the in circuit 30 described with reference to FIG. 2, except for the differential voltage aspects, and the inclusion of capacitor discharging circuitry.

In operation, the input voltage signal is applied, for example, from the pulse qualifier circuit 18 and digitizer 21 in FIG. 1, to differential input lines 52 and 53, which are connected to the bases of respective input transistors 55 and 56. The collectors of the input transistors 55 and 56 are connected to respective resistors 58 and 60, which, as explained below, establish the trip voltage of the comparator circuit 40, shown in FIG. 2. The input transistors 55 and 56 are connected essentially as switching transistors, so that only one or the other will be in a conducting state at any time.

A first set of latching transistors 62 and 63 are provided, with transistor 63 being connected in series with the input transistors 55 and 56, and with transistor 62 being connected in series with the resistor 58. A second set of latching transistors 65 and 66 are provided, with transistor 66 being connected in series with the resistor 60, and the transistor 65 being connected in series with the resistor 58 and transistor 62, as shown.

The delay voltage that is generated from the multiplier 16 in FIG. 1 is received on a voltage delay input terminal 70, which is connected to the base of a delay generating transistor 72, which is connected between the emitters of transistors 62 and 63, and a resistor 74. The delay voltage applied to the terminal 70, as described above, varies in dependence upon the phase difference between the input signal 14 and the output signal from the phase lock loop 22 on node 24, described above with reference to FIG. 1. The voltage developed by the transistor 72 is translated to the input transistors 55 and 56 to establish the switching voltage to switch their conduction states.

A constant or fixed reference voltage is applied to terminal 76, which is connected to the bases of the various load transistors 78. Thus, it can be seen, that in comparison to the prior art circuit in which the delay voltage that would be applied to terminal 70 was fixed and the bias voltage applied to the terminal 76 would vary, according to the present invention, the delay voltage applied to terminal 70 varies and the voltage applied to terminal 76 is fixed.

The voltages that are developed across the resistors 58 and 60 are applied to the bases of respective emitter follower transistors 82 and 84. The transistors 82 and 84 are connected, as well, to the collectors of the input transistors 55 and 56. It can, therefore, be seen that the transistors 82 and 84 have conduction states that follow or track those of the respective input transistors 56 and 55.

The emitters of the emitter follower transistors 82 and 84 are connected to the respective bases of capacitor discharging and charging transistors 86 and 87. The discharging transistor 86 is connected in series with a resistor 90 and a load transistor 92, and the charging transistor 87 is connected in series with the resistor 94 and load transistor 96. A capacitor 98 is connected between the emitters of the respective charging and discharging transistors 87 and 86. The capacitor 98, therefore, is charged by current that flows through the charging transistor 87 through the load transistor 92, whereas the capacitor 98 is discharged by current that flows through the transistor 86 and load transistor 96.

To assist the capacitor 98 in a rapid discharge, a discharge circuit that includes transistors 100 and 102 is provided. The transistors 100 and 102 have their bases connected respectively to the voltage output lines 104 and 106, whereby when the voltage on the output lines 104 and 106 changes state, the conduction states of the transistors 100 and 102 are switched. Thus, with the arrangement shown, when the capacitor 98 is discharging, the discharge path includes both load transistor 96 and discharge assist transistor 102 to provide a rapid discharge, in comparison to the charging mode, which includes only load transistor 92.

Figure 4:
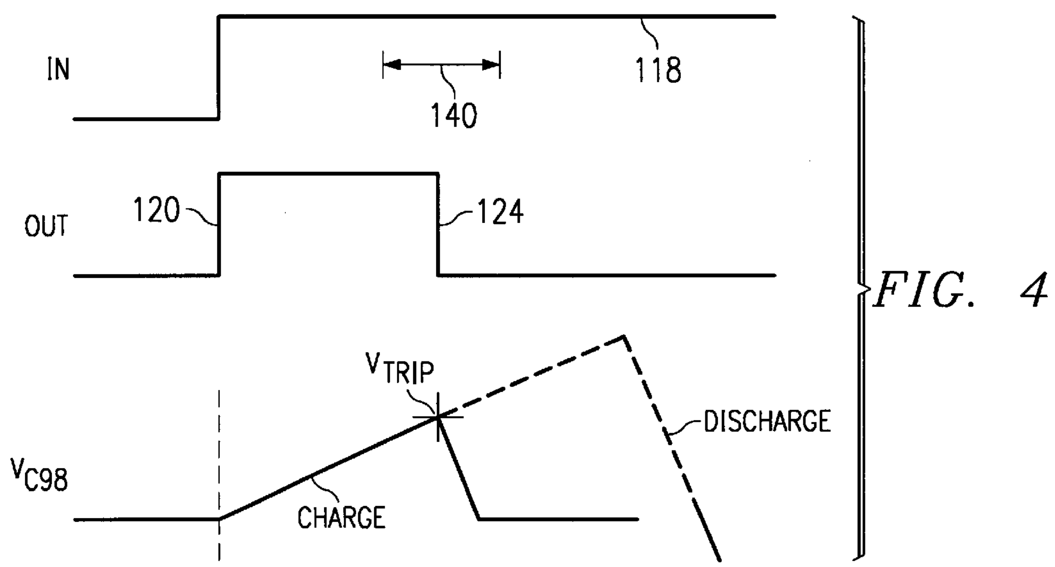
FIG. 4 is a series of graphs showing the voltages of the input voltage, output voltage, and voltage appearing across the capacitor of the circuit of FIG. 3, according to a preferred embodiment of the invention.

It can be seen that when the input transistors 55 and 56 change conduction states, the voltage appearing on lines 106 and 108 represents an input voltage, ΔV, which is translated immediately through output transistors 110 and 112 to the output lines 114 and 116, respectively. This is seen in the waveforms of FIG. 4, in which the rising edges of the input and output waveforms, 118 and 120, coincide.

Concurrently, the charge/discharge transistors 87 and 86 change states, causing the capacitor 98 to charge through the resistor 94, transistor 87, capacitor, and load transistor 92, at a rate that is determined by the current that is sourced by the transistor 87. Since the transistor 86 is not conducting, the charge on the side of the capacitor 98 that is connected to the load transistor 92 continues to discharge through the load transistor 92 to ground.

The capacitor 98 continues to charge until the threshold voltage established by the values of the resistors 58 and 60 in combination with the voltage applied by transistor 72 is reached. At this point, the charge and discharge capacitors 86 and 87 change conduction states, causing the output on the output lines 114 and 116 to fall, as shown by the waveform 124, in FIG. 4. The charging transistor 87 is turned off, so that the capacitor discharge path includes the load transistor 96 and discharge assisting transistor 102 to rapidly discharge the capacitor in preparation for the next input signal transition. By virtue of the transistor sizing, for example, the slope of the output discharge path of the capacitor may be four times steeper than the slope of the charging voltage on the capacitor 98. Concurrently, the state change of the charge/discharge capacitors 87 and 86 is fed back to the bases of transistors 62, 63 and 65, 66, which reset the states of the input transistors 55 and 56 in preparation for the next incoming signal state change.

It can be seen that since the falling edge 124 of the output voltage waveform is varied according to the delay voltage applied to the delay voltage input terminal 70, the phase lock loop 22, shown in FIG. 1, is configured to trigger on the falling edge and lock to it. Thus, the phase of the output signal from the phase lock loop 24 can be accurately locked to the phase of the input signal at node 12. As mentioned, because of the relationship of the delay time with respect to the voltage, which is a linear function following the formula:

$$\Delta T = \frac{C}{I}\Delta V$$

wherein

ΔT is the time delay, in seconds, applied by the delay circuit 50 on the input signal 14;

C is the capacitance of capacitor 98, in farads;

I is the current flowing through each of the charge/discharge transistors 86 and 87, in amperes;

and ΔV is the voltage difference between lines 106 and 108, in volts, in the circuit of FIG. 3.

It will be appreciated that, if desired, a certain number of known signal delays can be compensated by merely adding appropriate voltage levels to the voltage applied to the input delay terminal 70. Thus, the time range within which the falling edge 124 of the output pulse may exist, as denoted by the range of 140 in FIG. 4, only a small variation in delay voltage is necessary to appropriately adjust the time at which the falling edge 124 occurs, thereby accurately maintaining the phase of the input voltage 14 and output clock voltage on node 24. Additionally, because the ratio of ΔV to ΔT depends on the ratio of the capacitor to the current, according to the formula set forth above, which may be on the order of 400 to 1 or more, variations in the voltage that may be attributed jitter or other noise perturbations is relatively small, and, in most cases, negligible.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A pulse rephasing circuit for receiving an input signal and generating an output signal, comprising:

a circuit for generating a control voltage of a voltage magnitude related to a phase difference between said input and output signals; and a delay circuit for receiving said input signal to produce a delayed output signal that has been delayed with respect to the input signal by an amount related to the voltage magnitude of said control voltage;

wherein said delay circuit comprises a capacitor, a circuit for linearly charging said capacitor, a circuit for comparing said control voltage to a voltage charged on said capacitor, and a circuit for generating a state change in said output signal when said voltage charged on said capacitor exceeds said control voltage.

2. The pulse rephasing circuit of claim 1, wherein said circuit for generating said control voltage is a multiplier circuit.

3. The pulse rephasing circuit of claim 1, wherein said pulse rephase circuit further comprises a circuit to digitize said input signal prior to being received by said delay circuit.

4. A pulse rephasing circuit for receiving an input signal and generating an output signal, comprising:

a circuit for generating a control voltage of a voltage magnitude related to a phase difference between said input and output signals;

a delay circuit for receiving said input signal to produce a delayed output signal that has been delayed with respect to the input signal by an amount related to the voltage magnitude of said control voltage;

additional circuitry to which said input signal is applied before said input signal is received by said delay circuit, wherein said additional circuitry adds at least one known circuit delay to said input signal; and a voltage source for adding at least one compensating voltage to said control signal to compensate for said at least one known circuit delay.

5. A pulse rephasing circuit, comprising:

a multiplier for receiving an input signal;

a delay circuit for receiving the input signal to produce an output signal that has been delayed with respect to the input signal;

a phase lock loop for receiving the output signal to produce a clock signal for application to another input of said multiplier circuit; and wherein an output of said multiplier circuit providing a control voltage to said delay circuit that is related in a voltage magnitude to a phase difference between said input signal and said clock signal; and said delay circuit operating to delay the input signal by an amount related to the voltage magnitude of said control voltage;

wherein said delay circuit for receiving the input signal to produce said output signal that has been delayed with respect to the input signal comprises a capacitor, a circuit for linearly charging said capacitor, a circuit for comparing said control voltage of said magnitude related to a phase difference between said input and output signals with a voltage charged on said capacitor, and a circuit for generating a state change in said output signal when said voltage charged on said capacitor exceeds said voltage of magnitude related to a phase difference between said input and output signals.

6. The pulse rephasing circuit of claim 5 further comprising a circuit to digitize said input signal prior to said input signal being delayed by said delay circuit.

7. A pulse rephasing circuit, comprising:

a multiplier for receiving an input signal;

a delay circuit for receiving the input signal to produce an output signal that has been delayed with respect to the input signal;

a phase lock loop for receiving the output signal to produce a clock signal for application to another input of said multiplier circuit; and wherein an output of said multiplier circuit providing a control voltage to said delay circuit that is related in a voltage magnitude to a phase difference between said input signal and said clock signal; and said delay circuit operating to delay the input signal by an amount related to the voltage magnitude of said control voltage;

wherein said pulse rephasing circuit further comprises additional circuitry to which said input signal is applied before said input signal is delayed by said delay circuit, wherein said additional circuitry adds at least one known circuit delay to said input signal, and a voltage source for adding at least one compensating voltage to said control signal to compensate for said at least one known circuit delay.

8. A method for rephasing an input signal, comprising the steps of:

producing an output signal based upon and having the same frequency as said input signal;

generating a voltage of a voltage magnitude related to a phase difference between said input and output signals;

delaying the input signal by an amount related to the voltage magnitude of said control voltage prior to said step of producing an output signal;

wherein said step of delaying the input signal by an amount related to the magnitude of said control voltage prior to said step of producing an output signal comprises linearly charging a capacitor until a voltage on said capacitor exceeds said voltage of magnitude related to a phase difference between said input and output signals.

9. The method of claim 8 wherein said act generating a voltage of magnitude related to a phase difference between said input and output signals comprises multiplying said input and output signals.

10. A method for rephasing an input signal, comprising the steps of:

producing an output signal based upon and having the same frequency as said input signal;

generating a voltage of a voltage magnitude related to a phase difference between said input and output signals;

delaying the input signal by an amount related to the voltage magnitude of said control voltage prior to said step of producing an output signal;

wherein the method further comprises the step of adding a compensating voltage to said control voltage to compensate for known input signal delays, prior to said step of delaying.

11. A delay circuit for delaying an input signal by an amount depending upon a control voltage, comprising:

a capacitor;

a circuit for linearly charging a voltage onto said capacitor;

a switch controlled by said input signal to connect said circuit for linearly charging said voltage to said capacitor;

a comparator for generating an output signal; and a circuit for generating a voltage magnitude proportional to a phase difference between said input signal and said output signal;

said comparator being connected to compare said voltage charged on said capacitor with said voltage magnitude proportional to said phase difference between said input signal and said output signal to provide said output signal when said voltage charged on said capacitor becomes larger than said voltage magnitude proportional to said phase difference between said input signal and said output signal.

12. The delay circuit of claim 11 wherein said circuit for linearly charging said capacitor comprises a constant current source.

13. A pulse rephasing circuit for receiving an input signal and generating an output signal, comprising:

a circuit for generating a control voltage of a voltage magnitude related to a phase difference between said input and output signals; and a delay circuit for receiving the input signal to produce an output signal that has been delayed with respect to the input signal by an amount related to the voltage magnitude of said control voltage.

14. A pulse rephasing circuit, comprising:

a multiplier for receiving an input signal;

a delay circuit for receiving the input signal to produce an output signal that has been delayed with respect to the input signal;

a phase lock loop for receiving the output signal to produce a clock signal for application to another input of said multiplier circuit; and an output of said multiplier circuit providing a control voltage to said delay circuit that is related in a voltage magnitude to a phase difference between said input signal and said clock signal;

said delay circuit operating to delay the input signal by an amount related to the voltage magnitude of said control voltage.

15. A method for rephasing an input signal, comprising the steps of:

producing an output signal based upon and having the same frequency as said input signal;

generating a voltage of a voltage magnitude related to a phase difference between said input and output signals; and delaying the input signal by an amount related to the voltage magnitude of said control voltage prior to said step of producing an output signal.

* * * * *